(12) United States Patent
Boettcher et al.

(10) Patent No.: US 8,019,931 B2
(45) Date of Patent: Sep. 13, 2011

(54) METHOD AND CONTROL UNIT FOR OPERATING A NON-VOLATILE MEMORY, IN PARTICULAR FOR USE IN MOTOR VEHICLES

(75) Inventors: Joern Boettcher, Abstatt (DE); Jens Liebehenschel, Liederbach (DE); Markus Schmid, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 572 days.

(21) Appl. No.: 12/156,991

(22) Filed: Jun. 6, 2008

(65) Prior Publication Data

US 2009/0019213 A1    Jan. 15, 2009

(30) Foreign Application Priority Data

Jun. 8, 2007   (DE) .................... 10 2007 026 691

(51) Int. Cl.
   *G06F 12/00* (2006.01)
(52) U.S. Cl. ................... 711/103; 711/E12.008
(58) Field of Classification Search .................. 711/103
   See application file for complete search history.

(56) References Cited

U.S. PATENT DOCUMENTS

| | | | |
|---|---|---|---|
| 4,578,751 A | 3/1986 | Erwin | |
| 4,811,294 A | 3/1989 | Kobayashi et al. | |
| 5,298,673 A * | 3/1994 | Iizuka et al. | 84/615 |
| 2005/0122756 A1 * | 6/2005 | Higashino | 365/52 |
| 2007/0241882 A1 * | 10/2007 | Panttaja et al. | 340/521 |

FOREIGN PATENT DOCUMENTS

EP    1 729 305    12/2006

\* cited by examiner

*Primary Examiner* — Pierre-Michel Bataille
(74) *Attorney, Agent, or Firm* — Kenyon & Kenyon LLP

(57) ABSTRACT

A method for operating a nonvolatile memory, wherein the nonvolatile memory is configured to read out an erased data pattern when reading out a memory area that has not been written in, and performing the operations or tasks of setting a memory area for storing operating variable data that are to be written, providing operating variable data to be written in the nonvolatile memory, checking whether the operating variable data to be written correspond to the erased data pattern of the memory area set, writing the operating variable data in the determined memory area if the operating variable data that are to be written are different from the erased data pattern, and if the operating variable data that are to be written correspond to the erased data pattern, preventing writing the operating variable data in the determined memory area.

9 Claims, 2 Drawing Sheets

METHOD AND CONTROL UNIT FOR OPERATING A NON-VOLATILE MEMORY, IN PARTICULAR FOR USE IN MOTOR VEHICLES

RELATED APPLICATION INFORMATION

The present application is based on priority German patent application no. 10 2007 026 691.1, which was filed in Germany on Jun. 8, 2007, the disclosure of which is incorporated herein by reference.

The present application also relates to co-pending U.S. patent application Ser. No. 12/156,079, which is being filed on the same date as the present application, which is based on priority German patent application no. 10 2007 026 690.3-53, which was filed in Germany on Jun. 8, 2007, the disclosure of which is incorporated herein by reference.

The present application also relates to co-pending U.S. patent application Ser. No. 12/156,983, which is being filed on the same date as the present application, which is based on priority German patent application no. 10 2007 026 693.8-53, which was filed in Germany on Jun. 8, 2007, the disclosure of which is incorporated herein by reference.

FIELD OF THE INVENTION

The present invention relates to a method and a control unit for operating non-volatile memories, in particular flash memories and EEPROM memories, for use in the automotive field, for example.

BACKGROUND INFORMATION

Control units for the automotive field are generally used to control and monitor functions of the vehicle engine and/or additional electrical systems in the motor vehicle. Such a control device may be equipped with a non-volatile memory in order to store various operating variables, and the like, on a permanent basis, i.e., even if no supply voltage is applied, so that the control unit can access data from the past as well.

The memory addresses of such a nonvolatile memory are usually overwritten at time intervals, after a writing process to the address area, the respective memory cells normally having to be erased before values are able to be stored once again. Multiple writing in the same memory area may lead to damage to the respective memory cells, and to a considerable reduction in the service life of the nonvolatile memory. Erasing such a nonvolatile memory takes place, for example, by an erasing process in which all memory bits of the nonvolatile memory or of an addressed segment are put into a certain state, an erased state, in a suitable manner. When the appropriate address areas are read out (without prior writing). the erased state leads to a data pattern (designated below as erased data or as erased data pattern), for instance, to the output of logical "1"'s), so that, in the case of a simple reading out process of the address area, one is not able to recognize whether the address area previously had written in it data of a corresponding erased pattern or had not yet been written on.

Nonvolatile memories, such as flash memories, for use in control units, especially in the motor vehicle field, as a rule have data written in them at consecutive addresses. Address information concerning a starting address of the memory that is next to be written in may be recorded, in this instance, either by an appropriate address counter in a control unit, or by appropriate referencing data in a further area of the nonvolatile memory. In case of a fault, for instance, a failure of the power supply at the control unit, the content of the address counter in the control unit may be lost. If the failure in the power supply takes place between the writing of the data in a corresponding memory area of the nonvolatile memory and the writing of the appertaining referencing data, the memory area has already been written upon, but no referencing data have been stored to say that data have been written in the memory area. Consequently, when the control unit is next put into operation, it can only be determined, by analysis of the contents stored in the nonvolatile memory, beginning at which address the writing of data may be continued. That case is particularly critical in which a data pattern was last written in a corresponding memory area of the nonvolatile memory, that is before the occurrence of the fault, which corresponds to the erased pattern of the nonvolatile memory. When such a memory area is read out, it can therefore not be detected whether the corresponding memory area is in the erased state or had data written in it before the fault case corresponding to the erased data, and which would be read out from the corresponding memory area if this were in the erased state.

However, since a memory area in a nonvolatile memory, as used in such control units, is only able to be written in once, and an erasing process has first to be applied subsequently before a further writing process is able to be undertaken, it must consequently be assured that a memory area that has once been written upon is not written upon again.

SUMMARY OF THE INVENTION

It is therefore an object of the exemplary embodiments and/or exemplary methods of the present invention to provide a method and a control unit for operating a nonvolatile memory in which it is assured that a memory area already written upon will not be written upon again.

This object is attained by the method described herein and by the control unit as described herein.

Further advantageous developments of the exemplary embodiments and/or exemplary methods of the present invention are disclosed herein.

According to a first aspect, a method is provided for operating a nonvolatile memory, the nonvolatile memory being developed so that when a memory area is read out that has not been written on, an erased data pattern is read out. The method provides setting a memory area for the storing of operating variable data to be written, to make available operating variable data to be written in nonvolatile memory, and to check whether the operating variable data to be written correspond to the erased data pattern of the memory area set. Furthermore, it is provided that the operating variable data be written in the determined memory area if the operating variable data that are to be written are different from the erased data pattern, and, if the operating variable data to be written correspond to the erased data pattern, to prevent the writing of the operating variable data in the determined memory area.

Moreover, it is provided that the memory areas of the nonvolatile memory should be analyzed after the occurrence of a fault case, so as to determine those memory areas in which the erased data pattern is stored; and to make available at least one of the determined memory areas for the subsequent writing of operating variable data that are to be written.

According to one specific embodiment, after the writing or the preventing of writing of operating variable data, an address counter is updated or referencing data are written in a referencing section of the nonvolatile memory.

According to one further aspect, a control unit is provided, especially for use in a motor vehicle. The control unit includes a nonvolatile memory that is developed to read out an erased data pattern in response to the reading out of a memory area that is not written on, as well as a control unit that is developed to determine a memory area for storing operating variable data that are to be written, in order to make available operating variable data that are not to be written in the nonvolatile memory, and in order to check whether the operating variable data that are to be written correspond to the erased data pattern of the determined memory area. Furthermore, the control unit is developed to write the operating variable data in the determined memory area if the operating variable data that are to be written are different from the erased data pattern, or, if the operating variable data to be written correspond to the erased data pattern, to prevent the writing of the operating variable data in the determined memory area.

According to one further aspect, a computer program product is provided having machine-readable code stored on it, by the use of which a control unit is able to be activated to carry out the method just described.

In the following, exemplary embodiments of the present invention are elucidated in greater detail with reference to the appended drawing.

DETAILED DESCRIPTION

Figure 1:
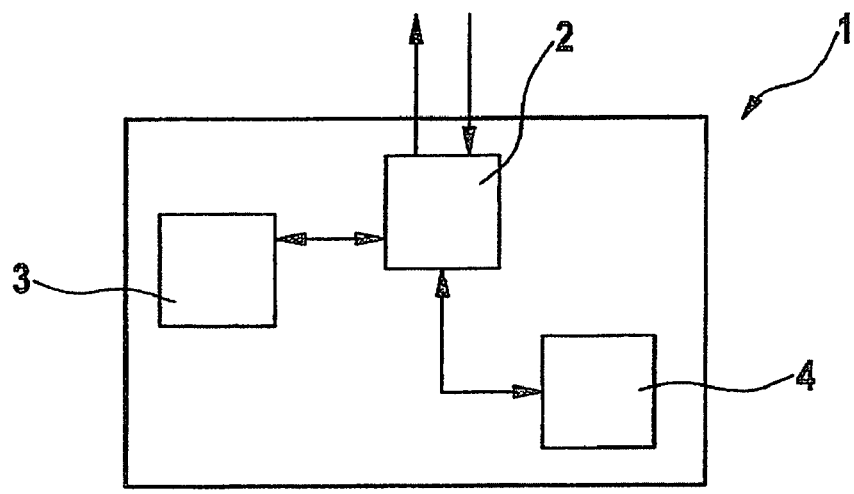
FIG. 1 shows a block diagram of a control device having a control unit according to an exemplary embodiment of the present invention.

FIG. 1 shows a control device 1 for use in the automotive field, for instance. Control device 1 has a control unit 2. Control unit 2 carries out methods and calculations for the control of vehicle systems such as the engine control, the control of additional electrical systems in the motor vehicle and the like. Control unit 2 is coupled to a program memory and fixed data memory 3 in which program commands for implementing the control method executed by control unit 2 as well as fixed data that cannot be changed are stored, e.g., constants, characteristic maps and the like. Fixed data memory 3 may be a non-volatile memory to which control unit 2 is unable to write in normal operation, e.g., a ROM, flash memory, EPROM, EEPROM and the like.

In the control of systems by control unit 2 it is often necessary to detect information about the systems to be controlled, environmental conditions and the like as operating variable data, and to update this information and permanently hold the most recent operating variable data in readiness, even over a period of time during which control device 1 is switched off for a particular period of time, i.e., is not supplied with a supply voltage. Data which are then stored in a possible working memory, such as a volatile write/read memory, e.g. a RAM, are lost during such a time period. For the durable storage of operating variable data, as a rule, a nonvolatile memory 4 that is able to be written on by control unit 2, for instance, in the form of a flash memory and the like, is provided, which control unit 2 is able to access in order to store or read out certain operating variables.

In order to reduce the load caused by frequent writing on nonvolatile memory 4, the size of nonvolatile memory 4 is provided to be larger than is required to store the operating variables. However, a memory management is necessary for this purpose. In detail, the operating variable data that are to be stored are written consecutively, that is, in sequence in the address area of nonvolatile memory 4 (by ascending or descending addresses).

The writing in the nonvolatile memory of operating variable data takes place consecutively, that is, new operating variable data to be written are appended directly to the end of the operating variable data written last. An appropriate referencing operation to the most recently written operating variable data may be stored in a referencing area of the nonvolatile memory or in the working memory of the control device, for instance, in an address counter or the like. In a fault case, e.g. the failure of the power supply, the content of the working memory may be lost. It may also happen that, after the writing of the operating variable data, the writing of the associated referencing information may be interrupted by the occurrence of the fault case, or not take place, so that no valid referencing data on the written operating variable data are present.

As a rule, the data value of the operating variable data to be written is not restricted, so that it may happen that a data pattern is written as operating variable data in a memory area that corresponds to the erased data pattern. As was described above, the erased data pattern is also output when each memory bit of the corresponding memory area is in an erased state. Consequently, when control device 1 is put into operation again after a fault case, it is no longer possible, with the aid of an analysis of nonvolatile memory 4, to determine which case is present. In the analysis of nonvolatile memory 4 after a fault case, the memory areas of nonvolatile memory 4 are searched for a corresponding erased pattern which directly follows a memory area detected as being written on with data. The memory area detected as being written upon with data may be detected, for example, in that the data stored in it do not correspond to the erased pattern, or that corresponding sequential data, which give the area written upon are stored in the nonvolatile memory.

If an erased pattern is detected in a memory area, this may say, on the one hand, that the corresponding memory area has not yet been written upon, and is thus available for subsequent writing, or, on the other hand, that the memory area has been written upon with the operating variable data that correspond to the erased pattern, and is therefore not available for subsequent writing.

Figure 2:
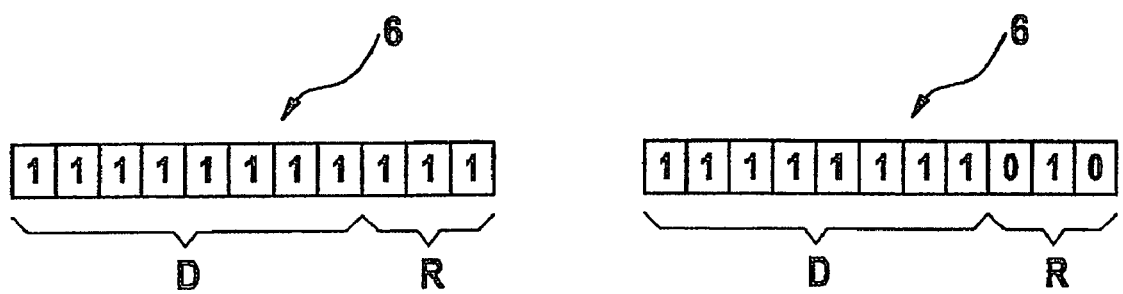
FIG. 2 shows an exemplary illustration of memory cells associated with a memory area of the nonvolatile memory in an erased state and a written state.

In FIG. 2 it is shown, with the aid of an example, why a memory area that has already been written upon must not be written upon again when this has already been done. A nonvolatile memory, especially a flash memory as is used in automotive applications, has memory areas 8 each having data bits D and correction bits R. This means that, to a memory area 6 which, as shown in this example, is able to store 8 bits of data, more that 8 memory cells, for instance, 11 memory cells may be allocated. When such a memory area 8 is written upon, if one of the memory cells for storing data bits is defective, correction bits are set (see right-hand side of FIG. 2). This repair cannot be detected by reading out. The written data may correctly be read out from the memory cell, although one of the memory cells is defective for storing data bits. Because of a possible writing on the memory cells for the correction bits, the memory area becomes unusable for further writing, since reprogrammed memory cells are unable to be reprogrammed again without an erasing process being first carried out.

In an additional type of flash memory as a nonvolatile memory, the memory cells, that is their gate dielectric, are at a potential that corresponds to an erased state. During reading out, this state is interpreted as a certain logical state, for instance, as a logical "1". Now if a "1" is written in the memory cell during a writing process, the potential state is changed, so that additional reprogramming of the memory cell to a logical "0" is no longer possible without a prior erasing process, without damaging the memory cell. Thus, during reading out, the same data pattern is yielded both for a memory area that has not been written upon and for the memory area that has been written upon before with the erased pattern, whereas, in the latter case, the memory area must not be overwritten without a prior erasing process.

Figure 3:
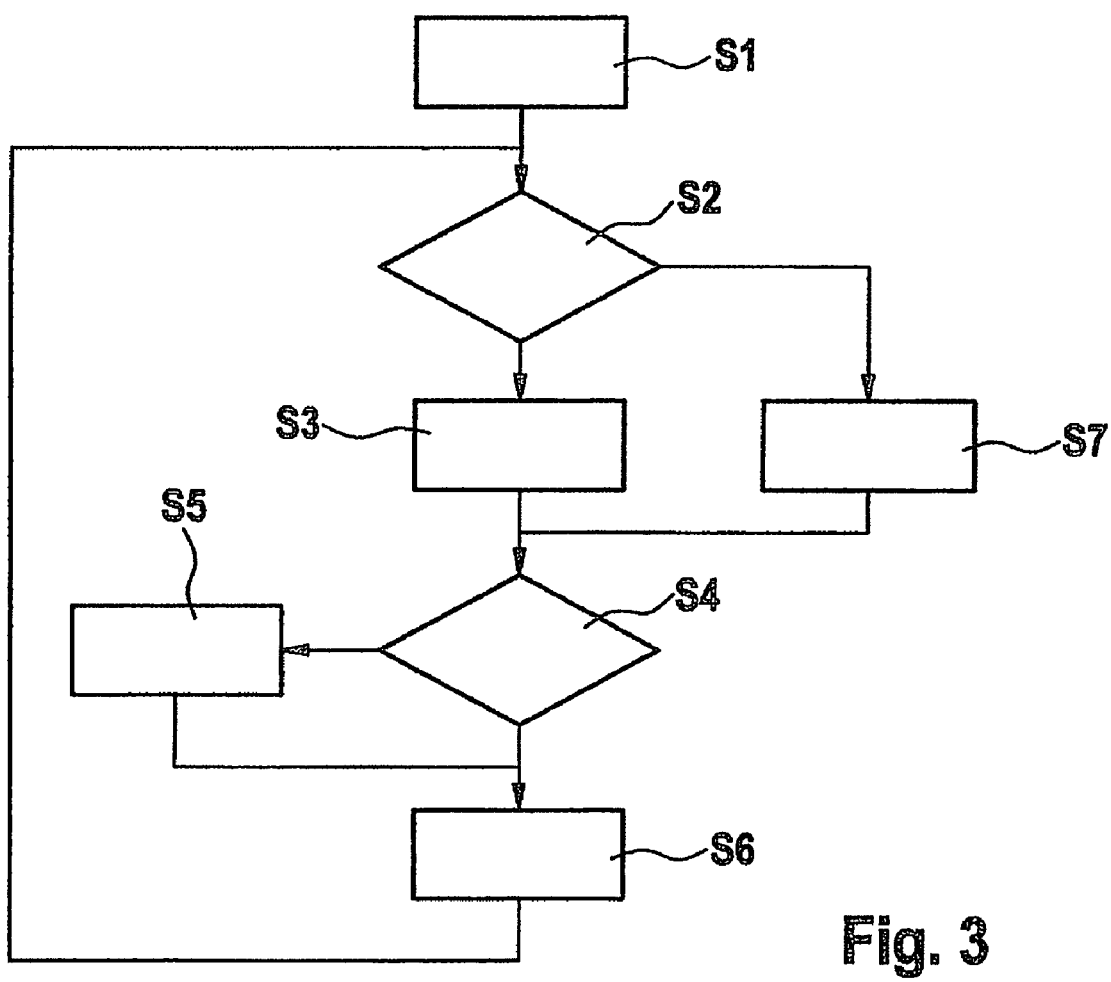
FIG. 3 shows a flow chart illustrating the exemplary method according to the present invention.

Now, according to the exemplary embodiments and/or exemplary methods of the present invention, a method is provided for operating nonvolatile memory 4 as shown in the flow chart in FIG. 3. In control unit 2, in this context, the operating variable data that are to be written are made available (step S1). In step S2 it is checked whether the operating variable data are the first data that are to be written after the occurrence of a fault case, such as an interruption of the power supply of the control device, as indicated, for example, by a fault marker or the like. If this is not the case, the method is continued with step S3, otherwise with step S7. In step S3 a memory area is set in nonvolatile memory 4, in which the operating variable data, to be written, are written. The memory area may be ascertained with the aid of an address counter in control device 2, or with the aid of the referencing data written in the nonvolatile memory, and, as a rule, it corresponds to the memory area that follows the memories last written in. In a subsequent step S4, control unit 2 analyzes the operating variable data to be written. If it is determined therein that the operating variable data would lead to the writing of a data pattern in the corresponding memory area to be written in, in nonvolatile memory 4, which does not correspond to the erased pattern, control unit 2 describes the corresponding memory area using the operating variable data that are to be written (step S5). If, on the other hand, it is determined therein that the operating variable data would lead to the writing of a data pattern in the corresponding memory area to be written in, in nonvolatile memory 4, which corresponds to the erased pattern, control unit 2 does not describe the corresponding memory using the data. After this query, the method is continued in both cases with step S6, in which either the address counter is incremented, depending on the memory organization, or an appropriate referencing information is written in nonvolatile memory 4, which refers to the memory area that has not been written in.

The method now returns to step S2. If no fault case occurs, subsequent operating variable data are written in a memory area that follows the corresponding memory area. Consequently, to be sure, nonvolatile memory 4 is not written in in every case with operating variable data following one another, but memory areas that have not been written in are interpreted as memory areas that have been written in if a corresponding referencing information is present for the corresponding memory area, or if, alternatively, additional written memory areas follow subsequently to the memory area that has been written in.

Conversely, after the control unit takes up operation again after a fault case has occurred, in step S7 nonvolatile memory 4 is analyzed, and the corresponding memory area, from which an erased pattern is able to be read out which follows an already written memory area, is assumed to be a memory area that has not been written in. This is set as a memory area in which an operating variable datum to be subsequently written is to be stored. That is, the corresponding memory area, since it was not written in before, may be used subsequently for writing with operating variable data that are to be written.

Because of the method described above, the problem is solved that one is able to ensure, after a fault case, that subsequent operating variable data are able to be written in the memory area, from which data, that correspond to an erased pattern, are read out.

The erased pattern, that is read out from a memory area that has not been written in, is essentially dependent on the type of nonvolatile memory, and its data pattern is essentially arbitrary. What is important is that control unit 2 checks the operating variable data that are to be written, to see whether they correspond to the erased pattern. If this is the case, writing is suppressed, and the memory areas following the corresponding memory areas have the next data written in.

The method for operating a non-volatile memory may be executed by the control unit. The method may be implemented therein by a hardware implementation, an implementation with the aid of software that corresponds to a computer program, and also by an implementation by hardware and software.

One advantage of the exemplary embodiments and/or exemplary methods of the present invention is that one may avoid that, in response to a faulty detection of a state after a fault case, memory cells that have already been written in are written in again without prior erasing. This would result in the service life of the memory cell being clearly reduced, or that unforeseeable states could occur in the memory cell.

What is claimed is:

1. A method for operating a nonvolatile memory, wherein the nonvolatile memory is configured so that an erased data pattern is read out when reading out a memory area that has not been written in, the method comprising:

setting a memory area for storing operating variable data that are to be written, the memory area being ascertained by an address counter;

providing operating variable data to be written in the nonvolatile memory;

checking whether the operating variable data to be written correspond to the erased data pattern of the memory area set;

writing the operating variable data consecutively in the determined memory area if the operating variable data that are to be written are different from the erased data pattern;

preventing the writing of the operating variable data in the determined memory area if the operating variable data that are to be written correspond to the erased data pattern; and incrementing the address counter after one of the writing or the preventing of the writing of operating variable data.

2. The method of claim 1, further comprising:

analyzing, after the occurrence of a fault case, the memory areas of the nonvolatile memory to determine the memory areas in which the erased data pattern is stored; and providing at least one of the determined memory areas for a subsequent writing of operating variable data that are to be written.

3. A method for operating a nonvolatile memory, wherein the nonvolatile memory is configured so that an erased data pattern is read out when reading out a memory area that has not been written in, the method comprising:

setting a memory area for storing operating variable data that are to be written;

providing operating variable data to be written in the nonvolatile memory;

checking whether the operating variable data to be written correspond to the erased data pattern of the memory area set;

writing the operating variable data in the determined memory area if the operating variable data that are to be written are different from the erased data pattern;

preventing the writing of the operating variable data in the determined memory area if the operating variable data that are to be written correspond to the erased data pattern;

analyzing, after the occurrence of a fault case, the memory areas of the nonvolatile memory to determine the memory areas in which the erased data pattern is stored; and providing at least one of the determined memory areas for a subsequent writing of operating variable data that are to be written.

4. A control device for a motor vehicle, comprising:
a nonvolatile memory configured to read out an erased data pattern in response to reading out a memory area that has not been written in; and
a control unit configured to perform the following:
  determine a memory area for storing operating variable data that are to be written, wherein the memory area is ascertained by an address counter in the control unit,
  provide operating variable data to be written in the nonvolatile memory,
  check whether the operating variable data to be written correspond to the erased data pattern of the determined memory area,
  write the operating variable data consecutively in the determined memory area if the operating variable data that are to be written are different from the erased data pattern, and
  prevent the writing of the operating variable data in the determined memory area if the operating variable data to be written correspond to the erased data pattern.

5. The control device of claim 4, wherein the control unit is configured to analyze the memory areas of the nonvolatile memory after an occurrence of a fault case, so as to determine those memory areas in which the erased data pattern is stored, and to set at least one of the determined memory areas for the subsequent writing of operating variable data that are to be written.

6. A control device for a motor vehicle, comprising:
a nonvolatile memory configured to read out an erased data pattern in response to reading out a memory area that has not been written in; and
a control unit configured to perform the following:
  determine a memory area for storing operating variable data that are to be written,
  provide operating variable data to be written in the nonvolatile memory,
  check whether the operating variable data to be written correspond to the erased data pattern of the determined memory area,
  write the operating variable data in the determined memory area if the operating variable data that are to be written are different from the erased data pattern,
  prevent the writing of the operating variable data in the determined memory area if the operating variable data to be written correspond to the erased data pattern,
  analyze the memory areas of the nonvolatile memory after an occurrence of a fault case, so as to determine those memory areas in which the erased data pattern is stored, and
  set at least one of the determined memory areas for the subsequent writing of operating variable data that are to be written.

7. A non-transitory computer readable medium having program code that is executable by a processor, comprising:
a program code arrangement for controlling a control unit to operate a nonvolatile memory, wherein the nonvolatile memory is configured so that an erased data pattern is read out when reading out a memory area that has not been written in, by performing the following:
  setting a memory area for storing operating variable data that are to be written, the memory area being ascertained by an address counter of the control unit;
  providing operating variable data to be written in the nonvolatile memory;
  checking whether the operating variable data to be written correspond to the erased data pattern of the memory area set;
  writing the operating variable data consecutively in the determined memory area if the operating variable data that are to be written are different from the erased data pattern;
  preventing the writing of the operating variable data in the determined memory area if the operating variable data that are to be written correspond to the erased data pattern; and
  incrementing the address counter after one of the writing or the preventing of the writing of operating variable data.

8. The computer readable medium of claim 7, further comprising:
analyzing, after the occurrence of a fault case, the memory areas of the nonvolatile memory to determine the memory areas in which the erased data pattern is stored; and
providing at least one of the determined memory areas for a subsequent writing of operating variable data that are to be written.

9. A non-transitory computer readable medium having program code that is executable by a processor, comprising:
a program code arrangement for controlling a control unit to operate a nonvolatile memory, wherein the nonvolatile memory is configured so that an erased data pattern is read out when reading out a memory area that has not been written in, by performing the following:
  setting a memory area for storing operating variable data that are to be written;
  providing operating variable data to be written in the nonvolatile memory;
  checking whether the operating variable data to be written correspond to the erased data pattern of the memory area set;
  writing the operating variable data in the determined memory area if the operating variable data that are to be written are different from the erased data pattern;
  preventing the writing of the operating variable data in the determined memory area if the operating variable data that are to be written correspond to the erased data pattern;
  analyzing, after the occurrence of a fault case, the memory areas of the nonvolatile memory to determine the memory areas in which the erased data pattern is stored; and
  providing at least one of the determined memory areas for a subsequent writing of operating variable data that are to be written.

* * * * *